United States Patent
Kris et al.

(10) Patent No.: US 10,936,004 B2
(45) Date of Patent: Mar. 2, 2021

(54) TEMPERATURE COMPENSATED CLOCK FREQUENCY MONITOR

(71) Applicant: Microchip Technology Incorporated, Chandler, AZ (US)

(72) Inventors: Bryan Kris, Gilbert, AZ (US); Igor Wojewoda, Tempe, AZ (US); Stephen Bowling, Chandler, AZ (US); Yong Yuenyongsgool, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 63 days.

(21) Appl. No.: 16/143,967

(22) Filed: Sep. 27, 2018

(65) Prior Publication Data
US 2019/0094905 A1    Mar. 28, 2019

Related U.S. Application Data

(60) Provisional application No. 62/564,828, filed on Sep. 28, 2017.

(51) Int. Cl.
| | |
|---|---|
| *G06F 1/08* | (2006.01) |
| *G06F 1/20* | (2006.01) |
| *G06F 11/30* | (2006.01) |
| *G01R 19/25* | (2006.01) |

(Continued)

(52) U.S. Cl.
CPC ........... *G06F 1/08* (2013.01); *G01R 19/2506* (2013.01); *G01R 23/15* (2013.01); *G04G 3/04* (2013.01);
(Continued)

(58) Field of Classification Search
CPC ........ G06F 1/08; G06F 1/206; G06F 11/3058; G05B 13/024; G05B 19/0425;
(Continued)

(56) References Cited

U.S. PATENT DOCUMENTS

| | | | |
|---|---|---|---|
| 7,391,273 B2 | 6/2008 | Seki et al. | 331/47 |
| 7,761,274 B1 * | 7/2010 | Pippin | G06F 1/206 |
| | | | 703/14 |

(Continued)

FOREIGN PATENT DOCUMENTS

| | | | | |
|---|---|---|---|---|
| CN | 105913807 A | 8/1916 | | G09G 3/34 |
| CN | 101128780 A | 2/2008 | | G04G 3/00 |
| JP | 2016119540 A | 6/1916 | | G01S 19/14 |

OTHER PUBLICATIONS

International Search Report and Written Opinion, Application No. PCT/US2018/053261, 11 pages, dated Jan. 2, 2019.

(Continued)

*Primary Examiner* — Nimesh G Patel
(74) *Attorney, Agent, or Firm* — Slayden Grubert Beard PLLC

(57) ABSTRACT

A temperature-compensating clock frequency monitor circuit may be provided to detect a clock pulse frequency in an electronic device that may cause erratic or dangerous operation of the device, as a function of an operating temperature of the device. The temperature-compensating clock frequency monitor circuit include a temperature sensor configured to measure a temperature associated with an electronic device, a clock having an operating frequency, and a frequency monitoring system. The frequency monitoring system may be configured to determine the operating frequency of the clock, and based at least on (a) the operating frequency of the clock and (b) the measured temperature associated with the electronic device, generate a corrective action signal to initiate a corrective action associated with the electronic device or a related device. The temperature sensor, clock, and frequency monitoring system may, for example, be provided on a microcontroller.

19 Claims, 4 Drawing Sheets

(51) Int. Cl.
  *G05B 13/02* (2006.01)
  *G01R 23/15* (2006.01)
  *H03L 1/02* (2006.01)
  *G04G 3/04* (2006.01)
  *G05B 19/042* (2006.01)

(52) U.S. Cl.
  CPC ............ *G05B 13/024* (2013.01); *G06F 1/206* (2013.01); *G06F 11/3058* (2013.01); *H03L 1/022* (2013.01); *G05B 19/0425* (2013.01); *G05B 2219/25039* (2013.01); *G05B 2219/33088* (2013.01)

(58) Field of Classification Search
  CPC ........... G05B 2219/25039; G05B 2219/33088; G01R 19/2506; G01R 23/15; H03L 1/022; G04G 3/04
  See application file for complete search history.

(56) References Cited

U.S. PATENT DOCUMENTS

| | | | |
|---|---|---|---|
| 9,838,025 B1* | 12/2017 | Deng | H03L 7/1072 |
| 9,997,116 B2 | 6/2018 | Muto et al. | |
| 2005/0228612 A1* | 10/2005 | Oh | G06F 1/206 702/132 |
| 2011/0249525 A1* | 10/2011 | Haass | G01R 31/31704 365/233.1 |
| 2012/0044000 A1* | 2/2012 | Hsieh | H03L 7/1974 327/156 |
| 2015/0116041 A1* | 4/2015 | Oishi | H03L 1/00 331/34 |
| 2015/0134995 A1* | 5/2015 | Park | G06F 11/3058 713/340 |
| 2016/0246347 A1* | 8/2016 | Rusu | G06F 1/324 |
| 2018/0005687 A1* | 1/2018 | Kawabe | G11C 11/406 |
| 2018/0006654 A1* | 1/2018 | Scott | H03L 1/02 |
| 2018/0293776 A1* | 10/2018 | Ray | G06F 9/4881 |

OTHER PUBLICATIONS

CN 101128780 A, U.S. Pat. No. 7,391,273 B2.
CN 105913807 A, U.S. Pat. No. 9,997,116 B2.
Chinese Office Action, Application No. 201880051223.7, 20 pages dated Dec, 25, 2020.

* cited by examiner

TEMPERATURE COMPENSATED CLOCK FREQUENCY MONITOR

RELATED PATENT APPLICATION

This application claims priority to commonly owned U.S. Provisional Patent Application No. 62/564,828 filed Sep. 28, 2017, the entire contents of which are hereby incorporated by reference for all purposes.

TECHNICAL FIELD

The present disclosure relates to timing circuits and, more particularly, to a temperature-compensated clock frequency monitor.

BACKGROUND

Electronic devices such as microprocessors and microcontrollers (MCUs) include, or have access to, at least one clock running at a known frequency to provide a controlled timing for processing instructions, e.g., for executing an application. The operating frequency of such clocks is often dependent on temperature. For example, RC oscillator type clocks often have a high temperature coefficient, resulting in frequency variations of up to 50% as a function of temperature, while crystal and ceramic resonator-based oscillators typically have a more moderate temperature coefficient.

These signal frequency variations in processor/MCU clocks may result in various functional problems, which may be compounded by temperature effects on a heat-sensitive device that incorporates the respective processor or MCU. In some instances, the device operating temperature has a strong effect on the maximum operating clock frequency. For example, a processor or MCU at a high temperature at high clock frequency may cause erratic operation, reduced component lifetime, or device failure. Thus, for some devices, higher operating temperatures may require lower operating frequencies, and similarly, higher operating frequencies may require lower temperatures. Furthermore, serial communications such as Ethernet, USB, UART, I2C, etc. typically require correct or predictable frequency to avoid communications errors.

Still further, in certain control applications such as power supply and motor control applications, operating the relevant control loop at an incorrect frequency may causing application or device damage, or danger to a user. Such electronic devices may include monitors to evaluate the processor/MCU clock performance. However, such monitors typically do not check for over-frequency operation.

SUMMARY

Embodiments of the present invention provide systems and methods for monitoring the clock signal frequency of a digital clock, e.g., of a process or microcontroller as a function of temperature, and taking a corrective action if the monitored clock signal frequency exceeds a temperature-dependent frequency limit. In some embodiments, systems and methods may include frequency limit logic or circuitry configured to select, calculate, or otherwise determine a temperature-dependent clock frequency limit metric, e.g., in the form of a clock pulse limit value (or alternatively, a frequency limit value) based on a sensor detected temperature associated with an electronic device. Clock monitoring logic may implement a clock pulse count window (e.g., using an enable signal, a clear signal, and a reference clock signal), and may count the number of clock pulses output by the clock being monitored within the defined clock pulse count window. A digital comparator or other logic may compare the measured clock pulse count with the clock pulse count limit value, and based on the output, determine whether to generate an interrupt signal or other notification for taking a correction action. For example, in some embodiments, an interrupt signal may be generated if the measured clock pulse count exceeds the clock pulse count limit value. An application may process the interrupt signal or initiate other relevant corrective measures, e.g., slowing the clock, applying a clock divider, or activating a cooling mechanism.

One embodiment provides a clock frequency monitor circuit including a temperature sensor configured to measure a temperature associated with an electronic device, a clock having an operating frequency, and a frequency monitoring system. The frequency monitoring system may be configured to determine the operating frequency of the clock; determine, based at least on (a) the operating frequency of the clock and (b) the measured temperature associated with the electronic device, to generate a corrective action signal; and generate the corrective action signal to initiate a corrective action associated with the electronic device or a related device.

In some embodiment, the electronic device is a microcontroller or a microprocessor.

In one embodiment, the temperature sensor, the clock, and the frequency monitoring system are provided on a microcontroller.

In one embodiment, the frequency monitoring system is configured to determine a clock frequency limit as a function of the measured temperature associated with the electronic device; determine the operating frequency of the clock; compare the operating frequency of the clock with the clock frequency limit; and generate a corrective action signal if the operating frequency of the clock exceeds the clock frequency limit.

In one embodiment, determining a clock frequency limit based on the measured temperature associated with the electronic device includes storing a plurality of clock frequency limit values corresponding with a plurality of different temperatures, and selecting one of the stored clock frequency limit values based on the measured temperature associated with the electronic device.

In one embodiment, the frequency monitoring system includes a plurality of data registers storing a plurality of clock frequency limit values corresponding with a plurality of different temperatures, and a multiplexer configured to select a particular clock frequency limit value from the plurality of data registers based on the measured temperature associated with the electronic device.

In one embodiment, determining the operating frequency of the clock comprises determining a clock signal count during a defined count window.

In one embodiment, generating a corrective action signal comprises generating an interrupt signal for controlling a program application.

In one embodiment, the temperature sensor is configured to measure an ambient temperature of an environment of the electronic device.

Another embodiment provides a method for monitoring a clock frequency including measuring using a temperature sensor, a temperature associated with an electronic device; measuring an operating frequency of a clock; determining, by frequency monitoring logic, whether to generate a corrective action signal based at least on (a) the measured operating frequency of the clock and (b) the measured temperature associated with the electronic device; and in response to the determination, generating the corrective action signal to initiate a corrective action associated with the electronic device or a related device.

BRIEF DESCRIPTION OF THE DRAWINGS

Example aspects and embodiments of the present disclosure are described below in conjunction with the following appended drawings.

DETAILED DESCRIPTION

Figure 1:
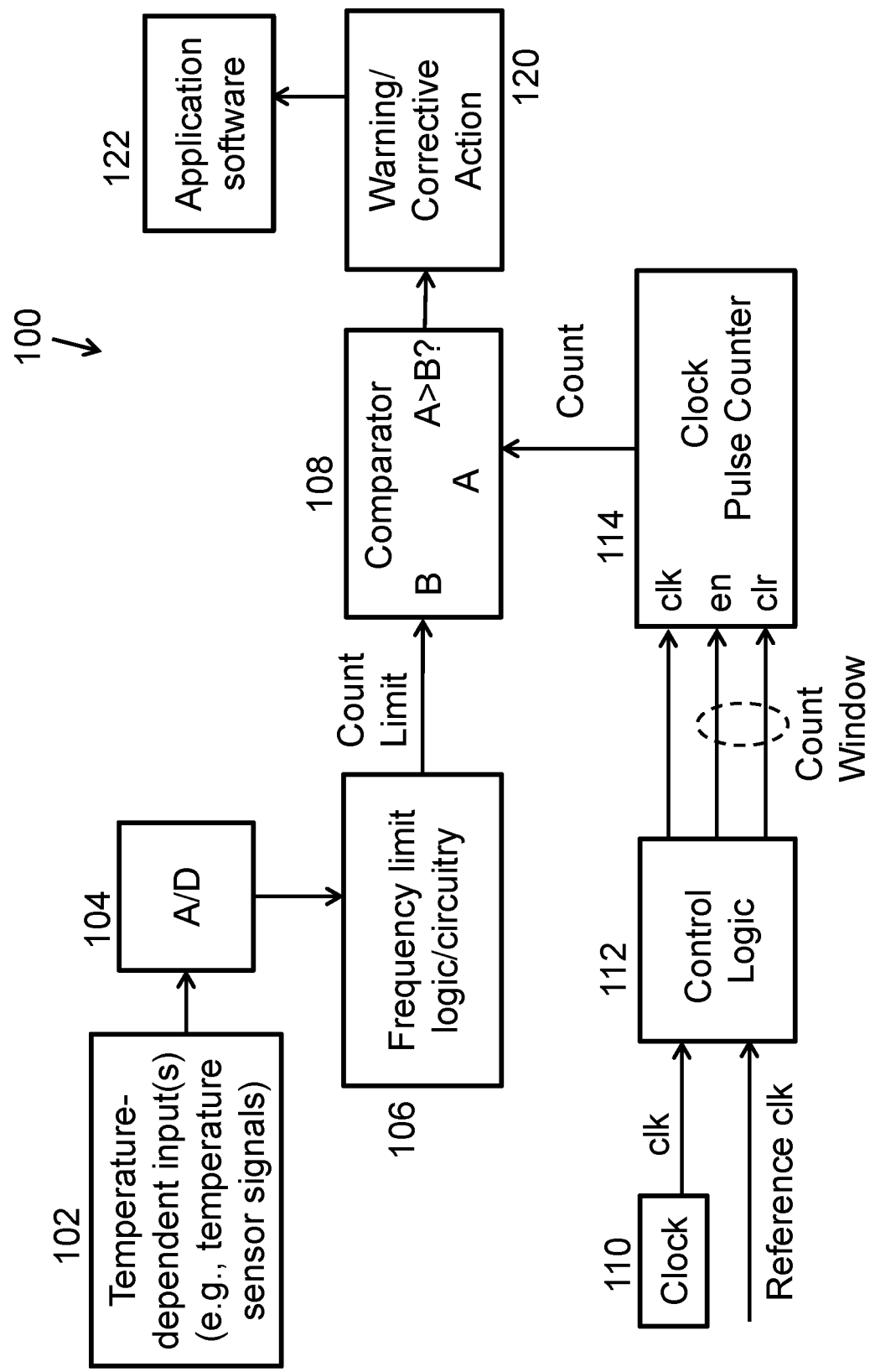
FIG. 1 illustrates an example temperature-compensated clock frequency monitor, according to an example embodiment of the present invention.

FIG. 1 illustrates an example temperature-compensated clock frequency monitoring system 100 for monitoring a clock 110, according to an example embodiment of the present invention. Monitoring system 100 may be implemented within any suitable electronic device using a clock signal, such as a microcontroller, processor, or power regulator, for example. The elements of monitoring system 100 may be implemented by analog circuitry, digital circuitry, instructions stored in a machine-readable medium for execution by a processor, or any suitable combination thereof.

System 100 may include at least one temperature-dependent input 102 configured to generate or otherwise output temperature-dependent data that varies as a function of a temperature associated with at least one electronic device, e.g., any of the elements of system 100, or a device in which system 100 is implemented, e.g., as a microcontroller, processor, or power regulator, or any other electronic device. For example, temperature-dependent input(s) 102 may include a temperature sensor configured to detect a temperature of an electronic device itself, or an air temperature or ambient temperature proximate the electronic device. The temperature sensor may generate analog signals proportional or having another relationship to the measured temperature. System 100 may include an A/D converter 104 to convert analog input data 102, e.g., analog temperature sensor signals, to digital data, e.g., digital temperature value(s). In another embodiment, the temperature sensor may be a digital sensor configured to output digital temperature values. In some embodiments, e.g., as discussed below with reference to FIG. 2, temperature-dependent input(s) 102 may additionally, or alternatively, include a operational voltage (e.g., $A_{dd}$) of the electronic device (e.g., microcontroller, processor, or power regulator, or any other electronic device), which varies as a function of the temperature of (or associated with) the electronic device.

System 100 may include frequency limit logic or circuitry 106 (e.g., embodied in hardware and/or software/firmware) configured to calculate, select, or otherwise determine a temperature-dependent clock frequency limit for clock 110 based on the digital temperature-related data received form A/D 104. As discussed below, the value of the frequency limit may be a quantification or representation of clock frequency that can be compared with a measured clock frequency. The frequency limit may represent a minimum or a maximum value for the measured clock frequency, beyond which a warning may be output or an interrupt or other corrective action may be taken. For example, the frequency limit may be a maximum allowable clock frequency (or representation thereof) at the temperature indicated by the temperature-dependent data from input(s) 102 (e.g., temperature sensor signals). If a measured clock frequency is beyond this frequency limit, then a warning may be output or an interrupt or other corrective action and notification may be triggered, as discussed below.

In the example embodiment shown in FIG. 1 (as well as the embodiment shown in FIG. 2), frequency limit logic or circuitry 106 is configured to output a frequency limit metric in the form of count limit value, which indicates a maximum or minimum clock pulse count for a specified count window (e.g., based on a reference clock signal). In other embodiments, frequency limit logic or circuitry 106 may output a frequency limit metric in the form of a frequency value rather than a count limit value. In either case, the frequency limit metric, indicated as "B," may be communicated to a digital comparator 108, which may include logic for comparing the frequency limit metric to a measured clock frequency metric of a clock signal, indicated as "A." If A is greater than B, an interrupt may be generated, as discussed below.

The frequency of the clock signal from clock 110 may be measured in any suitable manner. The manner of measuring or representing the clock frequency may correspond with the manner of representing the frequency limit. For example, the clock signal from clock 110 and a reference clock signal may be input to control logic 112. The control logic 112 may generate, in turn, a clock signal to monitor, an enable signal, and a clear signal, and output these signals to a clock pulse counter 114. The output clock signal from clock 110 may be formatted to appropriately form pulses that can be counted by the clock pulse counter 114.

Clock pulse counter 114 may use the signals from control logic 112 to define a count window for measuring the frequency of clock signals from clock 110. For example, clock pulse counter 114 may begin a running count of clock pulses upon receiving an enable signal from control logic 112, and end the count upon receiving a clear signal from control logic 112. Control logic 112 may control the respective timing of the enable and clear signals based on the reference clock, to thereby provide a standardized/constant count window. Upon reaching the end of the count window, the clock pulse counter 114 may output the measured clock pulse count to the digital comparator 108, which may then comparing the determined temperature-dependent frequency limit metric, e.g., represented by a count limit value, to the measured clock pulse count, as discussed below. (In an alternative embodiment, clock pulse counter 114 may calculate a clock frequency value based on the measured clock pulse count, which may be compared to a frequency limit value by digital comparator 108).

If digital comparator 108 determines that the measured clock pulse count exceeds the temperature-dependent count limit value (or the measured clock pulse count is otherwise out-of-bounds), suitable software or other logic instructions 120 may output a warning notification or take other corrective action. For example, instructions 120 may generate a warning notification that may be output to a user, indicating a high or low temperature warning. As another example, instructions 120 may include interrupt logic configured to generate an interrupt, alarm signal, or other relevant notification. Application software may 122 handle the interrupt. Other corrective measures, such as slowing the clock 110, applying a clock divider, or activating cooling mechanisms may be implemented.

In some embodiments, frequency limit logic/circuitry 106, comparator 108, and warning/corrective action instructions 120 may provide a multi-level analysis and response based on the magnitude and/or duration of temperature violation. For example, frequency limit logic/circuitry 106 may apply multiple different temperature-dependent frequency limit metrics (e.g. clock pulse count limits) corresponding with multiple temperature thresholds, comparator 108 may compare a measured clock pulse count against multiple temperature-dependent frequency limit metrics (e.g., multiple clock pulse count limits), and warning/corrective action instructions 120 may initiate different responses based on violations of the different temperature-dependent frequency limit metrics. For example, warning/corrective action instructions 120 may (a) output a warning notification in response to a determination by comparator 108 that a measured clock pulse count exceeds a first clock pulse count limit value, and (b) initiate a corrective measure (e.g., a software interrupt) in response to a determination by comparator 108 that the measured clock pulse count exceeds a second clock pulse count limit value, or in response to determining that the measured clock pulse count exceeds the first clock pulse count limit value for a defined minimum time period.

Figure 2:
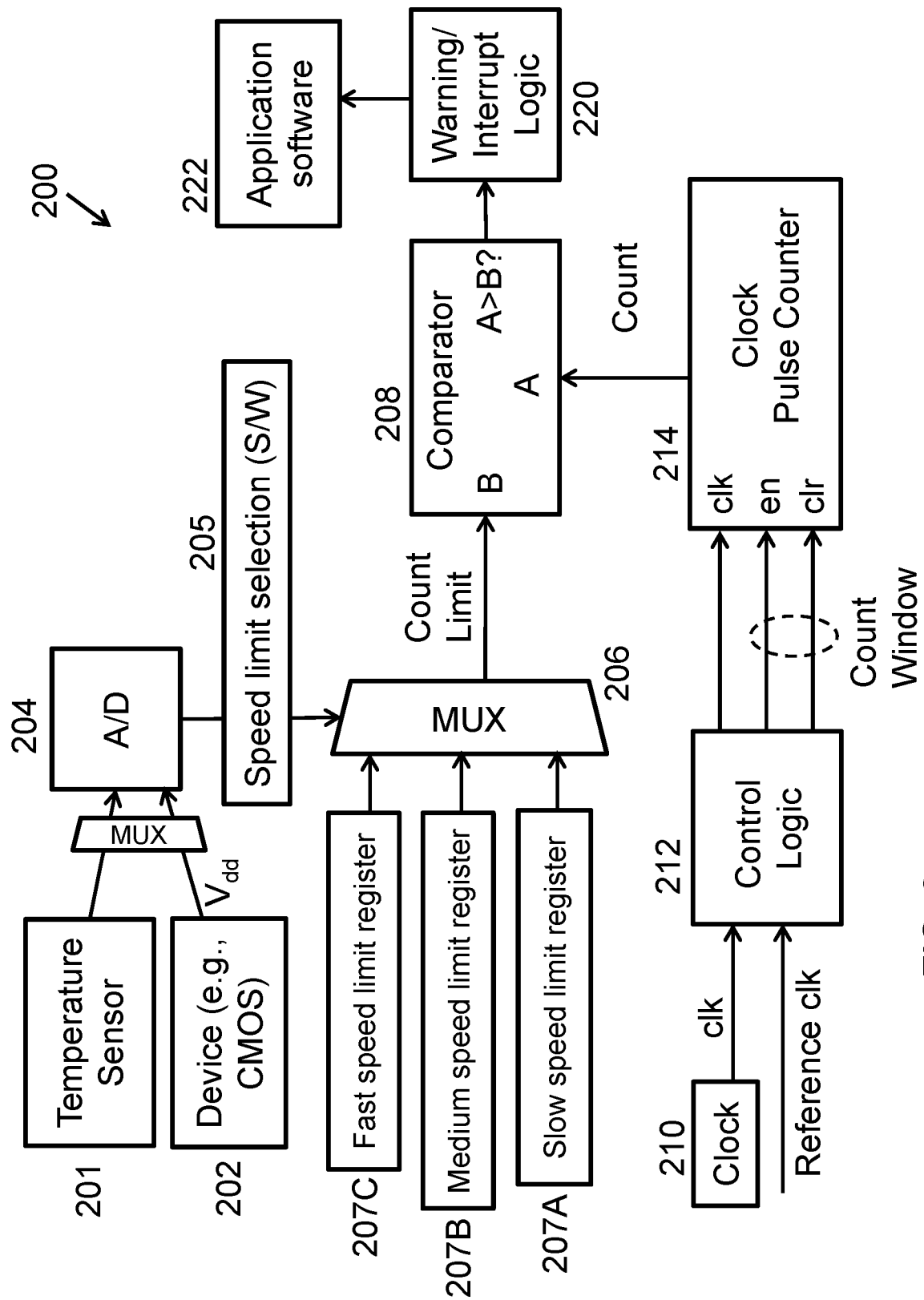
FIG. 2 illustrates an example temperature-compensated clock frequency monitor, including clock frequency limit values stored in data registers, according to an example embodiment of the present invention.

FIG. 2 illustrates an example temperature-compensated clock frequency monitoring system 200 for monitoring a clock 210, according to an example embodiment of the present invention. Monitoring system 200 may represent an embodiment of system 100 shown in FIG. 1, wherein the frequency limit logic or circuitry 106 for determining a temperature-dependent clock frequency limit includes a plurality of stored frequency limit values for a plurality of different temperatures, wherein an appropriate one of frequency limit values may be selected based on a currently measured temperature, as discussed below in more detail. Monitoring system 200 may be implemented within any suitable electronic device using a clock signal, such as a microcontroller, processor, or power regulator, for example. The elements of monitoring system 200 may be implemented by analog circuitry, digital circuitry, instructions stored in a machine-readable medium for execution by a processor, or any suitable combination thereof.

Like system 100, system 200 may include at least one temperature-dependent input configured to generate or otherwise output temperature-dependent data that varies as a function of a temperature associated with at least one electronic device, e.g., any of the elements of system 200, or a device in which system 200 is implemented, e.g., as a microcontroller, processor, or power regulator, or any other electronic device. In this example, temperature-dependent input(s) may include a temperature sensor 201 configured to detect a temperature associated with an electronic device 202, e.g., a temperature of the electronic device itself, or an air temperature or ambient temperature proximate the electronic device. The temperature sensor 201 may generate analog signals proportional or having another relationship to the measured temperature. System 202 may also (or alternatively) include, as a temperature-dependent input, a operational voltage (e.g., $V_{dd}$) of the electronic device 202 or another electronic device (e.g., microcontroller, processor, or power regulator, or any other electronic device), which varies as a function of the temperature of (or associated with) the relevant electronic device.

An A/D converter 204 may convert analog temperature-dependent input data, e.g., analog temperature sensor signals and/or analog $V_{dd}$ signals, to digital data, e.g., digital temperature or temperature-related value(s).

System 200 may include a plurality of data registers 207 storing a plurality of predefined clock frequency limit values corresponding with a plurality of different predefined threshold temperature metrics, in this example embodiment three data registers 207A-207C storing three predefined clock frequency limit metrics, which may for example correspond with three predefined threshold temperatures, e.g., 85° C., 105° C., and 125° C. In one embodiment, the stored clock frequency limit metrics may decrease as the temperature threshold value increases, as the maximum allowable clock frequency may decrease as the device temperature increases. The predefined clock frequency limit metrics may be frequency values, pulse count limit values, or any other values that represent a clock frequency limit. In the illustrated example, the predefined clock frequency limit metrics are pulse count limit values that indicate a maximum or minimum clock pulse count for a specified count window (e.g., based on a reference clock signal).

Further, in some embodiments, one or more predefined clock frequency limit metrics stored in data registers (e.g., registers 207A-207C) may be implemented as lower speed limits (or temperature minimum thresholds), such that the system may implements upper speed limits (or maximum temperature thresholds), lower speed limits (or minimum temperature thresholds), or any combination thereof.

A multiplexer 206 may be configured to select one of the clock frequency limit metric (e.g., a clock pulse count limit value) from the data registers 207A-207C based on the measured temperature value received from A/D converter 204. Multiplexer 206 may be configured to treat the threshold temperature values as upper or lower thresholds with respect to the measured temperature, depending on the particular embodiment. For example, where multiplexer 206 treats the threshold temperature values as lower thresholds, multiplexer 206 selects the fast speed clock frequency limit value (from register 207A) for measured temperatures below a first temperature threshold (e.g., 85° C.), selects the medium speed clock frequency limit value (from register 207B) for measured temperatures above the first temperature threshold but below a second temperature threshold (e.g., greater than or equal to 85° C. but below 105° C.), and selects the slow speed clock frequency limit value (from register 207C) for measured temperatures above the second temperature threshold (e.g., 125° C.).

Multiplexer 206 may output the selected frequency limit metric (e.g., clock pulse count limit value) to digital comparator 208, which may include logic for comparing the frequency limit metric to a measured clock frequency metric of a clock signal, e.g., as discussed above regarding digital comparator 108 of system 100.

The frequency of the clock signal from clock 210 may be measured in any suitable manner, e.g., in any manner discussed above regarding system 100. For example, a clock signal from clock 210 and a reference clock signal may be input to control logic 212, which may generate and output a clock signal to monitor, an enable signal, and a clear signal, and to a clock pulse counter 214. Clock pulse counter 214 may use the signals from control logic 212 to define a count window for measuring the frequency of clock signals from clock 210, e.g., as discussed above. Upon reaching the end of the count window, clock pulse counter 214 may output the measured clock pulse count to the digital comparator 208, which may then comparing the selected temperature-dependent frequency limit metric, e.g., represented by a count limit value, to the measured clock pulse count, as discussed below.

If digital comparator 208 determines that the measured clock pulse count exceeds the temperature-dependent count limit value (or the measured clock pulse count is otherwise out-of-bounds), warning/corrective action logic 220 may generate a warning notification, an interrupt, an alarm signal, or other relevant notification or action. Application software may 222 handle the interrupt. Corrective measures, such as slowing the clock 210, applying a clock divider, or activating cooling mechanisms may be implemented. As discussed above regarding FIG. 1, in some embodiments, speed limit selection logic 205, comparator 208, and warning/corrective action logic 220 may provide a multi-level analysis and response based on the magnitude and/or duration of temperature violation. For example, comparator 208 may compare the measured clock pulse count from counter 214 against multiple clock pulse count limit values stored in registers 207A-207C, and warning/corrective action logic 220 may initiate different responses based on violations of the different count limits. For example, warning/corrective action logic 220 may (a) output a warning notification in response to a determination by comparator 208 that a measured clock pulse count exceeds the fast speed count limit (from register 207C), and (b) initiate a first corrective measure (e.g., a software interrupt) in response to a determination by comparator 208 that the measured clock pulse count exceeds the medium speed count limit (from register 207B), and (c) initiate a second, more severe corrective measure (e.g., shutting down electronic device(s)) in response to a determination by comparator 208 that the measured clock pulse count exceeds the slow speed count limit (from register 207A).

Figure 3:
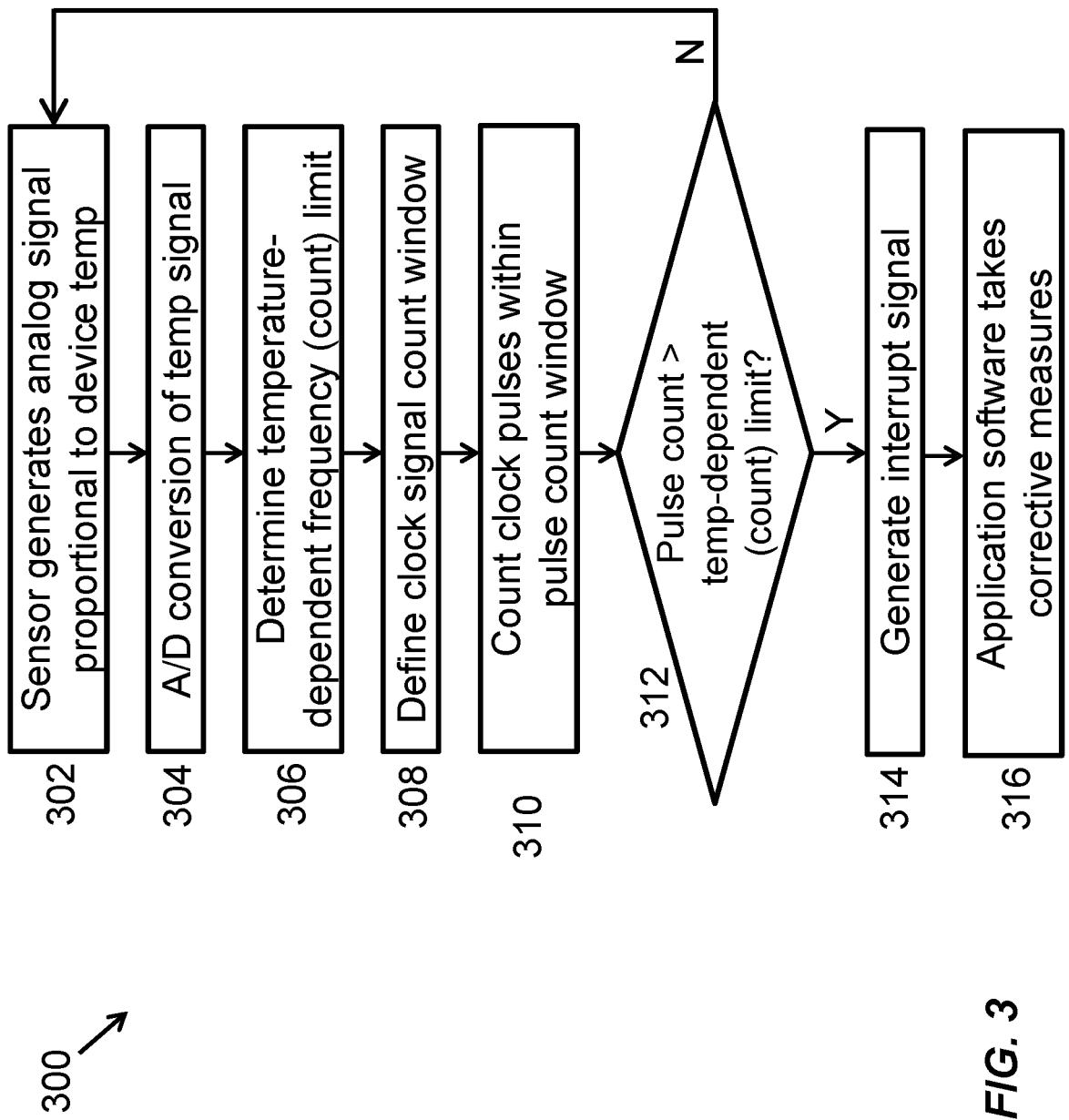
FIG. 3 illustrates an example method for temperature-compensated clock frequency monitoring, according to an example embodiment of the present invention.

FIG. 3 illustrates an example method 300 for temperature-compensated clock frequency monitoring of a digital clock, e.g., of a processor or microcontroller, according to an example embodiment of the present invention. Method 300 may incorporate any of the systems, components, and functionality discussed above regarding systems 100 and 200 shown in FIGS. 1 and 2.

At 302, a temperature sensor may generate analog signals proportional to a device temperature, e.g., indicating a temperature of the device itself or an environment in which the device is located. In some embodiments, as discussed above, additional temperature-dependent data, e.g., an operating voltage $V_{dd}$ of a relevant electronic device, may also be detected or obtained. At 304, an A/D converter may convert the analog temperature-dependent signals (e.g., sensor signals and/or $V_{dd}$ signals) to digital temperature signals. At 306, frequency limit logic or circuitry may select, calculate, or otherwise determine a temperature-dependent clock frequency limit metric based on the temperature indicated by the digital temperature signals. The clock frequency limit metric may be embodied as a clock pulse count limit value (for a specified count window), or a frequency value, for example.

At 308, clock monitoring logic (e.g., control logic and pulse count logic) may implement a clock pulse count window, e.g., using an enable signal, a clear signal, and a reference clock signal, e.g., as described above. At 310, pulse count logic may count the number of clock pulses (from the clock being monitored) within the defined clock pulse count window, and output the measured clock pulse count. At 312, a digital comparator or other logic may compare the measured clock pulse count determined at 310 with the clock pulse count limit value determined at 306, and based on the output, generate an interrupt signal or other notification (e.g., for taking a correction action) at 314. For example, an interrupt signal may be generated if the measured clock pulse count exceeds the clock pulse count limit value (or in another embodiment, if the measured clock pulse count is below a clock pulse count minimum limit value). At 314, a relevant application may process the interrupt signal or initiate other relevant corrective measures, e.g., slowing the clock, applying a clock divider, or activating a cooling mechanism.

Figure 4:
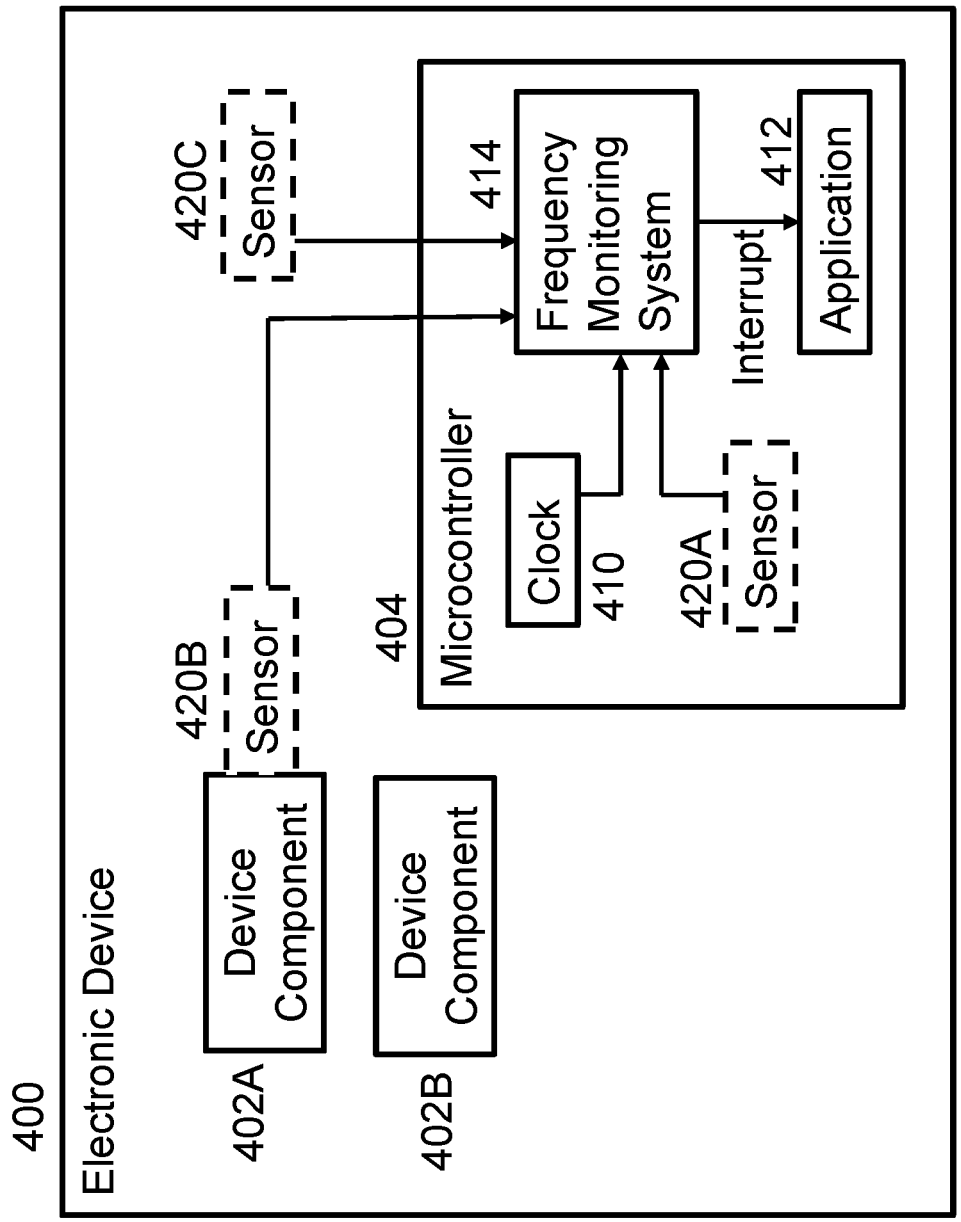
FIG. 4 illustrates an example electronic device including a microcontroller having a temperature-compensated clock frequency monitoring system for identifying and managing temperature-based clock frequency conditions, according to an example embodiment of the present invention.

FIG. 4 illustrates an example electronic device 400 including a plurality of device components 402 and a microcontroller 404 having a temperature-compensated clock frequency monitoring system for identifying and managing temperature-based clock frequency conditions, according to an example embodiment of the present invention. Microcontroller 404 may include a clock 410, at least one application 412, and a temperature-compensated clock frequency monitoring system 414, which may incorporate any of the concepts disclosed above. For example, clock frequency monitoring system 414 may be configured to determine a frequency limit for clock 410 as a function of a device temperature measured by at least one temperature sensor 420. The at least one temperature sensor 420 may be provided in the microcontroller 404, or arranged for direct temperature measurement of a particular device component 402A, or arranged for measuring an air temperature/ambient temperature, e.g., within a housing of device 400, or otherwise arranged for measuring a temperature associated with microcontroller 404 or electronic device 400. Clock frequency monitoring system 414 may be configured to measure a clock pulse frequency of clock 410, compare the measured clock pulse frequency to the determined temperate-dependent frequency limit, and if the measured clock pulse frequency exceeds the frequency limit, generate an interrupt for application 412 or other signaling for initiating a corrective action based on the detected frequency violation.

The invention claimed is:

1. A clock frequency monitor circuit, comprising:
    a temperature-related data source configured to provide temperature-related data associated with an electronic device;
    a clock having an operating frequency;
    a frequency monitoring system configured to:
        determine the operating frequency of the clock;
        determine a clock frequency limit based at least on (a) the temperature related data associated with the electronic device and (b) an operational voltage of the electronic device;
        compare the operating frequency of the clock with the clock frequency limit; and
        in response to determining the operating frequency of the clock exceeds the clock frequency limit, generate the corrective action signal to initiate a corrective action associated with the electronic device or a related device.

2. The clock frequency monitor circuit of claim 1, wherein the temperature-related data source configured to provide temperature-related data associated with an electronic device comprises a temperature sensor configured to generate sensor signals.

3. The clock frequency monitor circuit of claim 2 wherein the temperature sensor, the clock, and the frequency monitoring system are provided on a microcontroller.

4. The clock frequency monitor circuit of claim 2, wherein the temperature sensor is configured to measure an ambient temperature of an environment of the electronic device.

5. The clock frequency monitor circuit of claim 1, wherein the temperature-related data associated with the electronic device comprises a temperature-dependent operational voltage of the electronic device.

6. The clock frequency monitor circuit of claim 1, wherein the electronic device comprises a CMOS (complementary metal-oxide-semiconductor) device.

7. The clock frequency monitor circuit of claim 1, wherein the electronic device comprises a microcontroller.

8. The clock frequency monitor circuit of claim 1, wherein the electronic device comprises a microprocessor.

9. The clock frequency monitor circuit of claim 1, wherein determining a clock frequency limit based on the measured temperature associated with the electronic device comprises:
storing a plurality of clock frequency limit values corresponding with a plurality of different temperatures; and
selecting one of the stored clock frequency limit values based at least on (a) the measured temperature associated with the electronic device and (b) an operational voltage of the electronic device.

10. The clock frequency monitor circuit of claim 1, wherein the frequency monitoring system comprises:
a plurality of data registers storing a plurality of clock frequency limit values corresponding with a plurality of different temperatures; and
a multiplexer configured to select a particular clock frequency limit value from the plurality of data registers based on the measured temperature associated with the electronic device.

11. The clock frequency monitor circuit of claim 1, wherein determining the operating frequency of the clock comprises determining a clock signal count during a defined count window.

12. The clock frequency monitor circuit of claim 1, wherein generating a corrective action signal comprises generating an interrupt signal for controlling a program application.

13. The clock frequency monitor circuit of claim 1, wherein generating a corrective action signal comprises generating a warning notification.

14. A method, comprising:
receiving temperature-related data associated with an electronic device, the received temperature-related data including at least a detected temperature-dependent operational voltage of the electronic device;
measuring a temperature-dependent operating frequency of a first clock of the electronic device using a reference clock signal of a reference clock provided in the electronic device independent of the first clock;
determining, by frequency monitoring logic, a clock frequency limit based at least on the detected temperature-dependent operational voltage of the electronic device;
compare the measured temperature-dependent operating frequency of the clock with the clock frequency limit; and
determining, by frequency monitoring logic, the measured temperature-dependent operating frequency of the clock exceeds the clock frequency limit; and
in response to the determination, generating a corrective action signal to initiate a corrective action associated with the electronic device or a related device.

15. The method of claim 14, wherein receiving temperature-related data associated with an electronic device comprises receiving sensor data from a temperature sensor associated with the electronic device.

16. The method of claim 14, wherein the electronic device comprises a microcontroller.

17. The method of claim 14, wherein the electronic device comprises a microprocessor.

18. The method of claim 14, comprising:
storing a plurality of clock frequency limit values corresponding with a plurality of different temperatures; and
selecting one of the stored clock frequency limit values based at least on the detected temperature-dependent operational voltage of the electronic device.

19. The method of claim 14, wherein measuring a temperature-dependent operating frequency of a first clock of the electronic device using a reference clock signal of a reference clock provided in the electronic device independent of the first clock comprises:
using the reference clock signal of the reference clock to define a clock pulse count window; and
counting a number of clock pulses from the first clock within the defined clock pulse count window, the counted number of clock pulses representing the temperature-dependent operating frequency of the first clock.

* * * * *